United States Patent [19]

Turner

[11] Patent Number: 4,860,079
[45] Date of Patent: Aug. 22, 1989

[54] SCREENING OF GATE OXIDES ON SEMICONDUCTORS

[75] Inventor: Timothy E. Turner, Denton, Tex.

[73] Assignee: SGS-Thompson Microelectronics, Inc., Carrollton, Tex.

[21] Appl. No.: 167,546

[22] Filed: Mar. 14, 1988

Related U.S. Application Data

[62] Division of Ser. No. 55,335, May 29, 1987, Pat. No. 4,760,032.

[51] Int. Cl.⁴ .................... H01L 27/04; H01L 29/78
[52] U.S. Cl. ................................. 357/41; 357/23.14; 357/71; 357/85
[58] Field of Search ............... 357/41, 71, 23.1, 23.6, 357/45, 85, 23.14

[56] References Cited

U.S. PATENT DOCUMENTS

| | | | |
|---|---|---|---|
| 3,750,268 | 8/1973 | Wang | 357/42 |
| 3,851,245 | 11/1974 | Baker et al. | 328/158 R |
| 3,889,188 | 6/1975 | Trindade | 324/158 T |
| 4,224,733 | 9/1980 | Spadea | 357/42 |
| 4,296,372 | 10/1981 | Feverbaum | 357/29 |
| 4,542,340 | 9/1985 | Chakravarti et al. | 324/158 T |

FOREIGN PATENT DOCUMENTS

56-155542 12/1981 Japan .
57-164534 10/1982 Japan .
60-136323 7/1985 Japan .

OTHER PUBLICATIONS

Hoffman et al., IEEE J. of Solid State Circuits, vol. SC8, No. 5, Oct. 1973, pp. 298-305.

*Primary Examiner*—William D. Larkins
*Attorney, Agent, or Firm*—Kenneth C. Hill; Richard K. Robinson

[57] ABSTRACT

Testing of the gate oxides of all the transistors of a single die in a silicon wafer to be diced into a plurality of dice in a single operation is effected at an intermediate stage of the fabrication process by providing a metal layer contacting selectively each of the gate electrodes of a die at an intermediate stage of the processing and providing between the layer and the wafer a voltage of amplitude insufficient to cause significant tunneling current through good gate oxides but sufficient to cause significant tunneling current through defective gate oxides.

4 Claims, 1 Drawing Sheet

SCREENING OF GATE OXIDES ON SEMICONDUCTORS

This application is a division of application Ser. No. 55,335 filed 5/29/87, now U.S. Pat. No. 4,760,032.

This invention relates to the manufacture of silicon integrated circuit devices including MOS devices.

BACKGROUND OF THE INVENTION

MOS devices, particularly MOS transistors, make up a large part of most high-density integrated circuit devices. Such devices are characterized by a thin layer of silicon oxide over a portion of a monocrystalline silicon substrate over which lies a gate electrode, usually of polycrystalline silicon, to which is applied a voltage for affecting in a desired manner the properties of the underlying silicon.

For reliable operation, it is important that the integrity of the gate oxide by maintained. However, gate-oxide pinholes have long been one of the most serious problems facing MOS devices. Moreover, as MOS technology advances, and the density of MOS devices in an integrated circuit are increased, it becomes necessary to employ very thin oxides, sometimes only a few monolayers thick. Because of the importance of compatibility with existing circuits, it is usual to operate such thin oxide devices at the standard five volt power supply which imposes a very high electric field across the oxide. Use of such high electric fields makes it imperative that the oxide be free of defects, if the integrated circuit is to operate reliably in the field.

Defective devices once incorporated into equipment are very hard to find and expensive to replace, particularly if the equipment is in field use. Accordingly, there is considerable interest in methods to screen devices having defective oxides prior to their incorporation into equipment.

The most common method for screening oxides is burn-in. This typically involves operating a device at a higher than normal voltage level for a prescribed period of time, sometimes at elevated temperatures. Oxide failures tend to be greatly accelerated by higher voltages, and to a lesser extent by higher temperatures.

However, it is important that the applied voltage be less than the gate punch-through voltage, which is apt to be only slightly larger than the maximum power supply voltage in state-of-the-art devices. This imposes limits on the magnitude of the power supply voltage that can be safely employed without introducing hot electron problems or causing transistor shorts.

Another factor that is important is the need to stress essentially equally all of the gate oxides in an integrated circuit device. This becomes difficult in complex devices, such as random logic devices. In such complex devices, it is difficult to find a set of input states that will stress all of the internal transistors essentially equally. As a result, burn-in is becoming of less utility in screening gate oxides.

Another common method of screening gate oxides is to apply a short high voltage stress to the oxides during a final test of the device. This technique has been most successfully applied for testing the oxide layer of the MOS capacitors used in dynamic random access memories (DRAMs). This has worked well in this application because all the capacitor plates are tied to a common node. However, this technique is very difficult to apply to random logic devices because it requires a set of test vectors that stress each gate once and only once. Alternately, it would be required to add additional circuitry to allow all gates to be connected to one or a few nodes, which would undesirably add to the number of devices in the integrated circuit. For these reasons, this screening technique has not been applied to any significant extent to random logic devices.

There is the additional problem that as the wear out lifetime of the oxides approaches the expected lifetime of the device, the stress used to weed out potentially defective oxide layers may reduce the remaining lifetime of the good oxide layers.

To avoid these problems, non-destructive gate oxide screening techniques were developed. Such techniques look for very low levels of leakage through the oxide without requiring the need for high voltages to stress the oxide layers. This approach is based on the theory that a defective oxide will show a higher Fowler-Nordheim tunneling current even at low voltages. In this technique, a voltage is placed across the oxide layer being tested of a magnitude that provides a level of Fowler-Nordheim tunneling current that is just below the detectable level of a good oxide layer. As a result, a defective oxide layer will yield a detectable current while a good one will not and will not be degraded.

While this technique is readily applicable to DRAMs it cannot be readily applied to random logic devices because it is not possible to sense very small currents if the current path includes a pass transistor. Thus the gate electrode of the oxide layer being tested would require a direct low resistance path to an external sense device or to an on-chip test structure to detect the low level of current. This generally is not practicable.

SUMMARY OF THE INVENTION

The present invention is an improved gate oxide screening technique. It is based on the premise that the time dependent gate oxide failures are caused by defects in the oxide that would allow abnormally large tunneling currents in the region of the defect.

Several workers have shown that hole trapping at the silicon/silicon dioxide interface precedes the destructive breakdown of a gate oxide. The hole trapping increases the electric field in the region of the traps causing more tunneling which causes more hole trapping until an unstable runaway condition is set up and the defective area passes enough current to locally melt some of the overlying polysilicon electrode, then the melted silicon is pulled into the oxide defect causing shorting.

It is known that the Fowler-Nordheim tunneling current through a good oxide is very predictable and that defective oxides show a higher than normal tunneling current at voltages near the point at which tunneling can start to be detected at a good oxide. Moreover, the tunneling current tends to be an exponential function of the tunneling voltage. The invention involves the use of a forced voltage as a screen at, or preferably just below, the lowest value, necessary to pass detectable amounts of tunneling current in a good oxide. Defective oxides stressed at the same voltage will draw a much greater current. This screen can detect defective oxides without damaging the good oxides.

Moreover, to apply this technique to random logic devices, this screening is performed at an intermediate stage in the fabrication of such random logic devices.

In particular, in a preferred embodiment of the invention, the screening is done after the silicon wafer has been processed in normal fashion through the stage where the polysilicon gate layer has been deposited and patterned over the oxide-coated silicon substrate, covered by a deposited insulating layer (typically oxide) to be used to isolate the polycrystalline silicon layer from the subsequent first level metal interconnect layer and then covered with photoresist. Normally the next step would be to expose the photoresist over the deposited insulation layer selectively where the insulation layer is to be removed to permit contact between the subsequent first-level metal and the polycrystalline gate layer and between the subsequent first-level metal and the active silicon area contacts. Instead, at this point, the wafers to be screened would be exposed to a mask which exposed the photoresist over the deposited insulation only where there are to be formed the first-level metal-to-polysilicon contacts. When the deposited insulation is removed where photoresist is exposed and removed, and a metal layer is deposited thereover, a single metal contact is established by this metal layer to all of the gate electrodes. At this point, the metal layer is then patterned to divide it into die-sized areas by normal photolithographic techniques, so that access may be to the individual dice, each of which is to accommodate an individual random logic integrated circuit. Once the metal layer has been patterned into die-sized areas, a single probe may be stepped across the wafer landing, in turn, once on each die. Alternately, a "bed of nails" could make electrical contact to each die-shaped area in one operation. Once electrical contact has been established with a metal rectangle corresponding to one die area and another electrical contact made to the backside of the wafer, a voltage of the desired level is applied across each die area and the resulting current measured. This will force the same voltage on each gate electrode of the die area. If any gate in the die area is defective, the die area will draw an abnormal current sufficient to be detected as a failure. The location of each failing die area is mapped in the usual fashion, so that after dicing, the defective die may be removed before it is packaged.

Although in theory, this non-destructive test should weed out all dies with a defective oxide, in some instances there may be defective oxides which have a higher than normal hole trap density and so may not initially show a higher than normal tunneling current. If such a situation exists, this tunneling current screen may not be adequate. In such a case, there may also be added a brief high voltage screen at this same stage of the manufacturing process to identify these defects. The screening voltage and its duration should be chosen so as not to appreciably impact unfavorably the remaining lifetime of the good oxides.

Following this screening operation, the metal layer used for contacting the polycrystalline gate layer is removed, and another mask defining only the active contact regions applied. After the deposited insulation is opened at such active contact regions, the first level metal is deposited and the processing continued in the usual fashion.

The invention will be better understood from the following more detailed description taken with the accompanying drawing.

DETAILED DESCRIPTION

Figure 1:
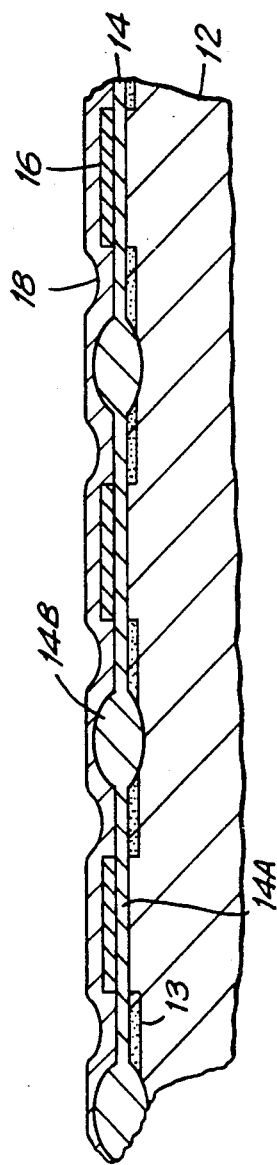
FIG. 1 shows a cross section of a portion of a silicon wafer at a particular stage in its fabrication in prior art fashion.

FIG. 1 shows a portion of a silicon wafer which has been prepared to an intermediate stage of its normal fabrication process. As is well known, it is typical to do most of the processing on relatively large wafers each of which is to be subsequently cut up into a plurality of dice, each of which will include at least one integrated circuit. Depicted in FIG. 1 is a portion of a single die area of a much larger wafer. It should be appreciated that the drawing is not to scale. In the stage depicted, the silicon wafer 10 whose bulk is of single crystal silicon has an overlying surface layer of silicon oxide 14. The layer 14 includes thin gate oxide portions 14A and thicker field oxide portions 14B dividing the wafer into discrete active regions, each of which will include one or more transistors. As shown, each active region is designed to accommodate a single transistor. To this end, each active region includes a pair of heavily doped regions 13 spaced apart to serve as the source and drain of the transistor. A gate electrode 16 of polycrystalline silicon overlies the thin gate oxide region 14A in each active region. Additionally, an insulating layer, typically of silicon dioxide 18, is shown deposited over the silicon wafer. Normally photolithography would next be used to open this layer 18 to expose portions of the polycrystalline gate electrodes and also portions of the source and drain regions of the silicon wafer and then the first-level metal deposited as a layer over the patterned silicon layer to contact both the polycrystalline silicon electrodes and the active silicon wafer. This metal layer in turn would then be appropriately patterned.

Figure 2:
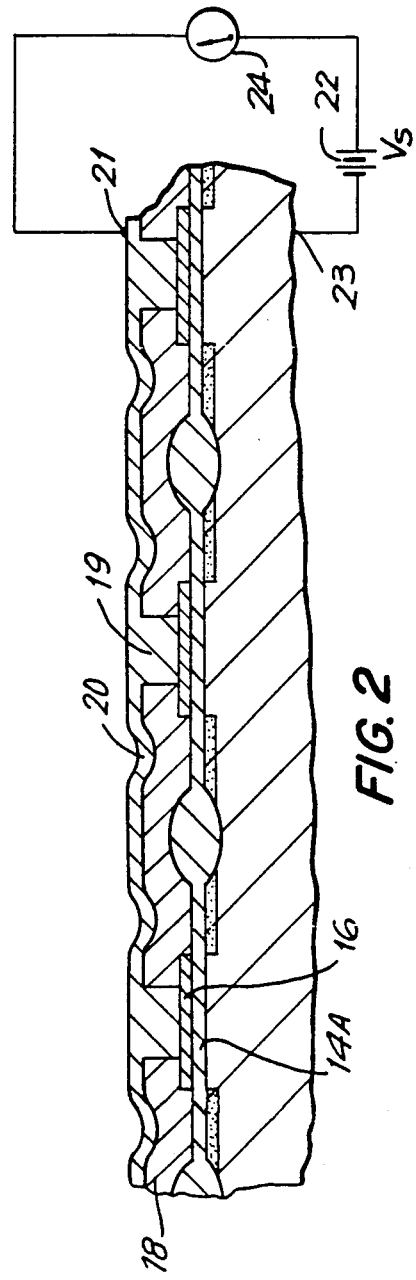
FIG. 2 shows at a subsequent stage a cross section of the silicon wafer modified for the practice of the invention.

However, for the practice of the present invention, the silicon layer is patterned to expose only the polysilicon electrodes and thereafter there is deposited a metal layer 20, typically of aluminum, which is used to contact each of the polycrystalline electrodes 16 by way of the contact openings or vias 19, (shown filled by metal in FIG. 2). This layer would be patterned so that an individual portion would overlie a single die area of the wafer, as discussed. The resultant is seen in FIG. 2. Thereafter one electrical contact 21 is provided to this metal layer 20 and another electrical contact to the back side of the wafer as shown schematically by connection 23. A voltage source 22 and a current meter 24 are then connected serially between these two contacts. The voltage supplied by the source 22 is adjusted to be just below the value that results in a detectable current in the meter 24 for a defect-free gate oxide layer underlying the polycrystalline gate electrode. Optionally, a higher voltage can also be applied to wear out defective oxides while not appreciably damaging good oxides. As discussed previously, an abnormally large current would indicate a die area which included at least one defective gate oxide and so would be defective.

Also as previously discussed, in some instances it would be advantageous also to include a short high-voltage pulse as a further screen.

After each die area is tested, the metal layer 20 would be etched away and photolithography would be used in conventional fashion to open the insulating layer 18 also to expose regions of the active device, such as the source and drain regions, where connection is desired by the first level metal. After the insulating layer 17 has been so prepared, the first level metal is deposited uniformly over the silicon wafer and thereafter patterned in the usual fashion to provide connections, as desired, to the polycrystalline electrodes and the source and drain regions.

Thereafter, the silicon wafer is processed in the usual fashion and eventually diced to form individual dice each of which includes an integrated circuit.

It should be understood that various modifications may be made in the specific illustrative embodiment described without departing from the spirit and scope of the invention. For example, it is feasible to test in one operation only a selected group of transistors in an individual die area, in which case only those transistors in the group to be tested would have their gate electrodes connected to the metal layer used for testing. This can be readily done by opening the insulating layer 18 only over their gate electrodes before deposition of the metal layer so that only their gate oxide layers will be tested in parallel in a single operation.

What is claimed:

1. A product in an intermediate stage in the manufacture of a semiconductor integrated circuit device adaptable for testing in parallel gate insulators of transistors in each individual die portion of a semiconductive wafer comprising a semiconductive wafer of a size for subsequent dicing into a plurality of transistors, and a plurality of source and drain zones in the wafer for inclusion in the plurality of transistors, a gate insulating layer over the wafer, a plurality of gate electrodes over the gate insulating layer, each between a pair of source and drain zones in the wafer for inclusion in a transistor, a deposited insulating layer extending over the wafer including contacting entirely the surfaces of the source and drain zones of the wafer and including apertures selectively only over regions of gate electrodes whose underlying gate insulating layer portions are to be tested, a temporary conductive contact layer designed for removal before the wafer is diced and extending over the deposited insulating layer, making low resistance connections selectively to gate electrodes through apertures in the deposited insulating layer, and patterned to include discrete portions, each of which contacts in parallel only gate electrodes of an individual die portion of the wafer and so is useful for testing in parallel the associated gate insulating layers in each individual die portion.

2. The product of claim 1 in which the wafer is silicon and the gate insulating layer is silicon oxide.

3. The product of claim 2 in which the conductive contact layer in which each discrete portion contacts in parallel each of the gate electrodes in its individual die portion of the wafer.

4. A product in an intermediate stage in the manufacture of a semiconductor integrated circuit device adaptable for testing in parallel gate insulators of transistors in each individual die portion of a semiconductive wafer comprising a semiconductive wafer of a size for subsequent dicing into a plurality of transistors, and a plurality of source and drain zones in the wafer for inclusion in the plurality of transistors, a gate insulating layer over the wafer, a plurality of gate electrodes over the gate insulating layer, each between a pair of source and drain zones in the wafer for inclusion in a transistor, a deposited insulating layer over the wafer and including apertures selectively over regions of each of the gate electrodes in each individual die portion, and a conductive contact layer designed for removal before the wafer is diced, extending over the deposited insulating layer making low resistance connections to the gate electrodes through the apertures in the deposited insulating layer, and patterned to include a plurality of discrete portions, each of which contacts selectively in parallel each gate electrode of an individual die portion of the wafer and so is useful for testing in parallel the associated gate insulating layers in each individual die portion.

* * * * *